United States Patent
Han et al.

[19]

[11] Patent Number: 6,123,791
[45] Date of Patent: Sep. 26, 2000

[54] CERAMIC COMPOSITION FOR AN APPARATUS AND METHOD FOR PROCESSING A SUBSTRATE

[75] Inventors: Nianci Han, San Jose; Hong Shih, Walnut; Jie Yuan, San Jose; Danny Lu, Milpitas; Diana Ma, Saratoga, all of Calif.

[73] Assignee: Applied Materials, Inc., Santa Clara, Calif.

[21] Appl. No.: 09/124,323

[22] Filed: Jul. 29, 1998

[51] Int. Cl.[7] .............................. H05H 1/00; C23C 16/00
[52] U.S. Cl. ................... 156/1; 118/723 I; 118/723 AN; 501/127
[58] Field of Search .......................... 156/345; 118/723 I, 118/715, 716, 723 E; 501/127, 152

[56] References Cited

U.S. PATENT DOCUMENTS

| | | | |
|---|---|---|---|
| 4,244,743 | 1/1981 | Blackburn et al. | 118/723 E |
| 5,498,313 | 3/1996 | Bailey et al. | 501/127 |
| 5,680,013 | 10/1997 | Dornfest et al. | 156/345 |
| 5,753,044 | 5/1998 | Hanawa et al. | 118/723 I |

FOREIGN PATENT DOCUMENTS

| | | |
|---|---|---|
| 0 849 767 A2 | 6/1998 | European Pat. Off. . |
| 35 43 802 A1 | 6/1987 | Germany . |
| 94 21 671 | 8/1996 | Germany . |
| 10067554 | 3/1998 | Japan . |
| WO 98/14980 | 4/1998 | WIPO . |

*Primary Examiner*—Shrive Beck
*Assistant Examiner*—P. Hassanzadeh
*Attorney, Agent, or Firm*—Townsend and Townsend and Crew

[57] ABSTRACT

A ceramic composition of matter for a process kit and a dielectric window of a reactor chamber wherein substrates are processed in a plasma of a processing gas. The ceramic composition of matter contains a ceramic compound (e.g. $Al_2O_3$) and an oxide of a Group IIIB metal (e.g., $Y_2O_3$). A method for processing (e.g. etching) a substrate in a chamber containing a plasma of a processing gas. The method includes passing processing power through a dielectric window which is formed from the ceramic composition of matter.

52 Claims, 4 Drawing Sheets

CERAMIC COMPOSITION FOR AN APPARATUS AND METHOD FOR PROCESSING A SUBSTRATE

BACKGROUND OF THE INVENTION

1. Field of the Invention

The present invention relates to a ceramic composition of matter for an apparatus and method of processing (e.g., etching, chemical or physical vapor deposition, etc.) a substrate in a chamber containing a plasma of a processing gas. More specifically, the present invention provides a ceramic composition of matter which may be used to manufacture process kits and dielectric windows wherethrough processing power passes for etching a semiconductor substrate in a reactor chamber containing a high density plasma of a processing gas. The ceramic composition of matter has a high erosion resistance during etching of a semiconductor substrate to prevent corrosive materials from forming inside the reactor chamber.

2. Description of the Prior Art

The semiconductor industry relies on high throughput, single substrate processing reactors which can be used for a variety of different processes such as thermal chemical vapor depositions (CVD), plasma-enhanced CVD (PECVD), plasma-assisted etching, and deposition topography modification by sputtering. Some processing reactors include processing reactor chambers having a dielectric member (i.e., a dielectric window) wherethrough processing power passes to aid in sustaining a plasma from a processing gas within the reactor chamber for processing a wafer substrate.

Process kits are sometimes employed within the reactor chamber as an aid to processing a wafer substrate.

Process kits typically include a capture ring which is supported by a pedestal assembly for retaining a wafer substrate in a generally stationary position for processing. Process kits also typically include a focus ring which in operation is supported by the capture ring for assisting in confining plasma processing gas over the wafer substrate to optimize the processing of the same.

Dielectric members (e.g., dielectric windows) and process kits are generally constructed of a ceramic material, such as high parity alumina ceramics containing 99.5% by weight or higher aluminum oxide ($Al_2O_3$). When high density halogen-containing plasmas contact alumina dielectric members and alumina process kits during etching of wafer substrates, erosion of alumina occurs, causing the formation of large particles and contaminant compounds which can damage patterned wafer substrates.

Therefore, what is needed and what has been invented is an improved ceramic composition of matter from which dielectric members and process kits may be constructed. What is further needed and what has been further invented are dielectric members (i.e., dielectric windows) and process kits which are all highly resistant to erosion during etching of a wafer substrate in a high density plasma of an etchant gas.

SUMMARY OF THE INVENTION

The present invention accomplishes its desired objects by broadly providing a plasma reactor (e.g. an inductively coupled RF plasma reactor) for processing (e.g., etching, chemical or physical vapor deposition, etc.) substrates. The plasma reactor includes a reactor chamber having a chamber wall and a dielectric member (i.e., a dielectric window) supported by the chamber wall. The dielectric member includes a ceramic composition comprising a ceramic compound and an oxide of a Group IIIB metal from the periodic table by Mendeleef. A pedestal assembly is disposed in the reactor chamber for supporting substrates in the reactor chamber. A processing gas-introducing assembly is engaged to the reactor chamber for introducing a processing gas into the reactor chamber. The plasma reactor further includes a processing power-transmitting member disposed in proximity to the reactor chamber and connected to a processing power source for transmitting power into the reactor chamber to aid in sustaining a plasma from a processing gas within the reactor chamber. If the plasma reactor is an inductively coupled RF plasma reactor, the pedestal assembly is coupled to a bias RF source and the processing power-transmitting member is a coil inductor which is connected to an inductively coupled RF power source.

A process kit may be positioned in the reactor chamber for assisting in the processing of the substrates. The process kit is supported by the pedestal assembly, and includes a capture ring member and a focus ring member, both of which include a ceramic composition comprising a ceramic compound and an oxide of a Group IIIB metal.

The ceramic compound for the ceramic composition of the present invention is preferably selected from the group consisting of silicon carbide, silicon nitride, boron carbide, boron nitride, aluminum nitride, aluminum oxide, and mixtures thereof. More preferably, the ceramic compound is aluminum oxide, especially since it is relatively inexpensive and readily available. The aluminum oxide should be sufficiently pure that it does not "out-gas" or include contaminants that could be sputtered onto a substrate during process operation, and it should be chemically stable when exposed to the particular etching processes contemplated. Other materials which may be used to form the ceramic compound include by way of illustration, but are not limited to, the oxide and fluoride forms of aluminum, magnesium and tantalum. The aluminum oxide or other metal-oxide ceramic can be a single crystal oxide, polycrystalline oxide, or amorphous oxide.

The Group IIIB metal for forming a Group IIIB metal oxides of the present invention is preferably a metal selected from the group consisting of scandium, yttrium, the cerium subgroup, and the yttrium subgroup. More preferably, the Group IIIB metal is yttrium; therefore, the oxide of a Group IIIB metal is preferably yttrium oxide.

The ceramic compound and the oxide of a Group IIIB metal may combine in any suitable proportion, preferably such that the ceramic composition comprises from about 30% by weight to about 95% by weight of the ceramic compound and from about 5% by weight to about 70% by weight of an oxide of a Group IIIB metal. More preferably, the ceramic composition comprises a major proportion of the ceramic compound and a minor proportion of the oxide of a Group IIB metal.

Alternatively, the ceramic composition comprises from about 30% by weight to about 95% by weight of the ceramic compound and from about 5% by weight to about 70% by weight of an oxide of a Group IIIB metal, and a minor proportion of a binder agent or a minor proportion of a binder agent and/or an additive agent. The preferred process for forming or producing the dielectric member (i.e., the dielectric window) and the process kit from the ceramic composition is by thermal processing a powdered raw mixture comprising the ceramic compound, the oxide of a Group IIIB metal, a suitable additive agent, and a suitable binder agent.

The present invention also accomplishes its desired objects by broadly providing a method for processing at least one substrate in a chamber containing a plasma processing gas comprising the steps of:

(a) providing a chamber having a chamber wall and containing at least one substrate and a plasma processing gas for processing at least one substrate, and including a dielectric member engaged to the chamber wall and comprising a ceramic composition including a ceramic compound (e.g., $Al_2O_3$) and an oxide of a Group IIIB metal (e.g. $Y_2O_3$); and (b) introducing processing power through the dielectric member and into the chamber of step (a) to process the at least one substrate in the plasma processing gas.

The present invention further also accomplishes its desired objects by further broadly providing a method of etching a metal layer on a substrate comprising the steps of:

(a) providing a substrate supporting a metal layer;

(b) disposing the substrate in a chamber including a chamber wall, and a dielectric member supported by the chamber wall and comprising a ceramic composition including a ceramic compound, such as alumina, and an oxide of a Group IIIB metal, such as yttrium oxide;

(c) introducing a processing gas into the chamber of step (b); and (d) introducing processing power through the dielectric member and into the chamber of step (b) to etch the metal layer on the substrate in a high density plasma of a processing gas.

It is therefore an object of the present invention to provide a plasma reactor for processing substrates.

It is another object of the present invention to provide a method for processing a substrate in a chamber containing a plasma processing gas.

It is yet another object of the present invention to provide a ceramic composition which is preferably employed for manufacturing or forming a dielectric window and a process kit.

These, together with the various ancillary objects and features which will become apparent to those skilled in the art as the following description proceeds, are attained by these novel apparatuses and methods, a preferred embodiment thereof shown with reference to the accompanying drawings, by way of example only, wherein:

DESCRIPTION OF THE PREFERRED EMBODIMENTS OF THE INVENTION

Figure 1:
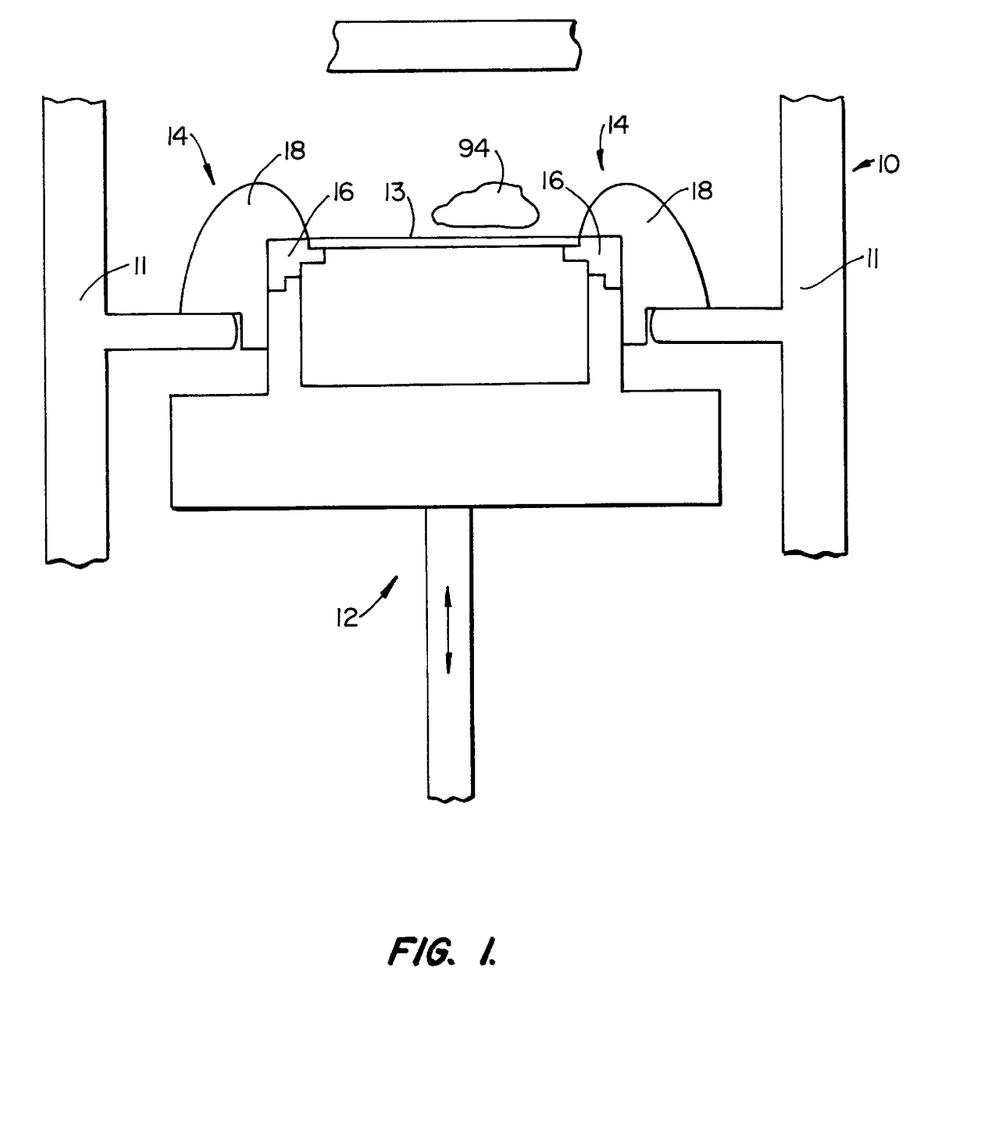
FIG. 1 is a partial side elevational view of a process chamber having a pedestal assembly disposed therein including a wafer-capture ring comprising the ceramic composition of the present invention and engaged to the pedestal assembly for retaining a wafer substrate thereon, and a focus ring comprising the ceramic composition of the present invention and capable of being supported by the pedestal assembly for assisting in concentrating a plasma of a processing gas over a wafer substrate.
Figure 2:
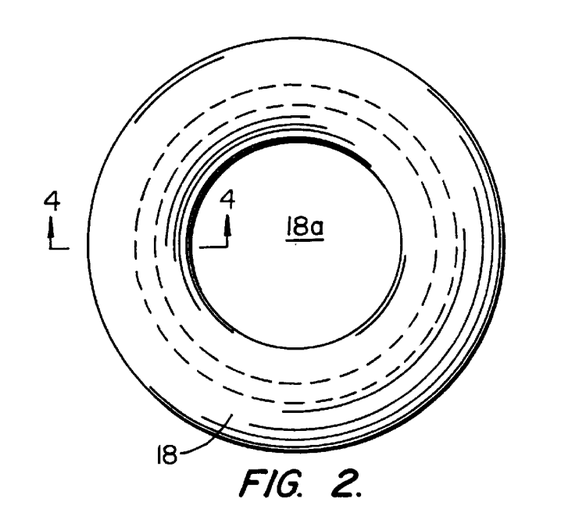
FIG. 2 is a top plan view of the focus ring comprising the ceramic composition of the present invention.
Figure 3:
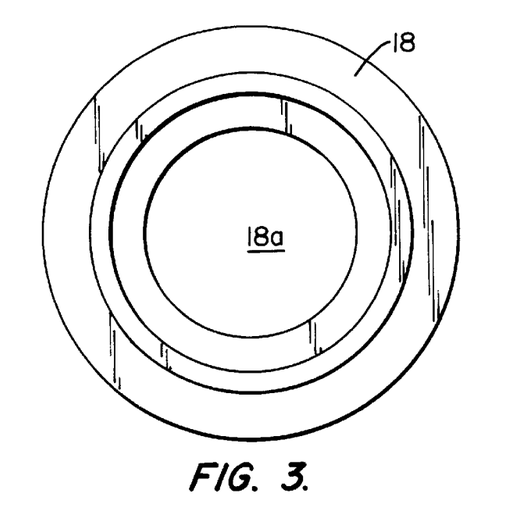
FIG. 3 is a bottom plan view of the focus ring in FIG. 2.
Figure 4:
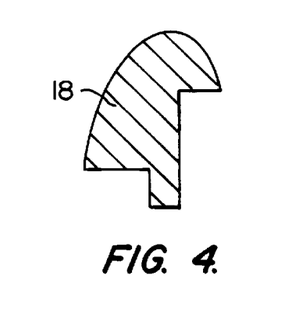
FIG. 4 is a vertical sectional view taken in direction of the arrows and along the plane of line 4—4 in FIG. 2.
Figure 5:
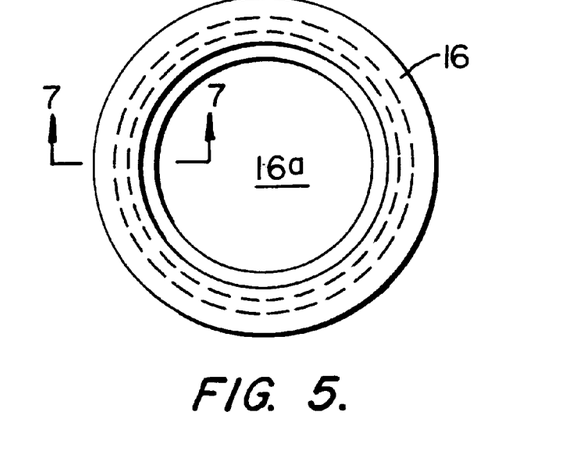
FIG. 5 is a top plan view of the wafer-capture ring comprising the ceramic composition of the present invention.
Figure 6:
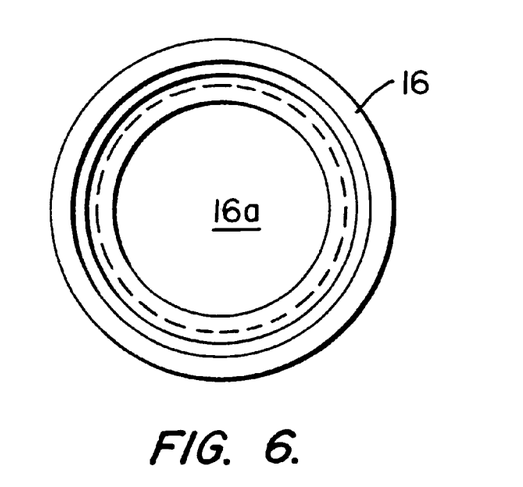
FIG. 6 is a bottom plan view of the wafer-capture ring in FIG. 5.
Figure 7:
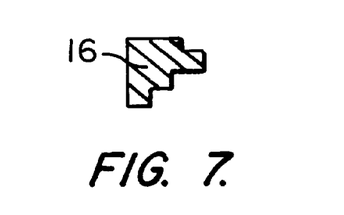
FIG. 7 is a vertical sectional view taken in direction of the arrows and along the plane of line 7—7 in FIG. 5.

Referring in detail now to the drawings wherein similar parts of the present invention are identified by like reference numerals, there is seen a process chamber, schematically illustrated as 10, having a chamber wall 11 and a pedestal assembly, generally illustrated as 12, for supporting a substrate, such as substrate or semiconductor wafer 13, while being processed within the process chamber 10. The chamber wall 11 supports a dielectric member 20. A process kit is seen in FIG. 1 as being generally illustrated as 14 and supported by the pedestal assembly 12 for assisting in the processing of the wafer substrate 13. The process kit 14 consists of a wafer-capture ring 16 connected to the pedestal assembly 12 for keeping the wafer substrate 13 stationary while it is being processed. The process kit 14 also consists of a focus ring 18 for assisting in keeping a high density plasma 94 of a processing gas concentrated and/or positioned over the wafer substrate 13. The wafer-capture ring 16 and the focus ring 18 have respective ring openings 16a and 18a (see FIGS. 2–7).

The wafer substrate 13 may be processed within the process chamber 10 by any plasma processing procedure, such as by plasma etching for patterning integrated circuit (IC) metal interconnect devices. Other forms of processing substrates which are included within the spirit and scope of the present invention include chemical vapor deposition, physical vapor deposition, etc. During the plasma process, processing power (e.g., RF power, magnetron power, microwave power, etc.) passes through the dielectric member 20, which includes a dielectric window of a nonconductive material such as a ceramic dome, etc., and becomes coupled to the high density plasma 94 of the processing gas. If the plasma process is plasma etching, metal etching of metals (e.g. platinum, copper, aluminum, titanium, ruthenium, iridium, etc.) is conducted while being supported by substrates.

The dielectric member 20 and the process kit 14 are manufactured of a ceramic material. When the wafer substrate 13 is processed, ceramic dielectric member 20 and ceramic process kit 14 erodes, causing generation of contaminating particulates. Erosion of the dielectric member 20 and the process kit 14 is particularly profound when the wafer substrate 13 is processed by etching in a high density plasma of an etchant gas, especially when the etchant gas is a halogen-containing etchant gas, such as $Cl_2$ and $BCl_3$. High density plasma may be defined as a plasma of an etchant gas having an ion density greater than about $10^9/cm^3$, preferably greater than about $10^{11}/cm^3$. The source of the high density plasma may be any suitable high density source, such as electron cyclotron resonance (ECR), helicon resonance or inductively coupled plasma (ICP)-type sources.

It has been discovered that if the dielectric member 20 and the process kit 14 are manufactured from the ceramic composition of the present invention, the dielectric member 20 and the process kit 14 essentially do not erode during processing of the wafer substrate 13, especially by plasma etching in a high density plasma. Therefore, the dielectric member 20 (i.e. the dielectric window), as well as the process kit 14 including the wafer-capture ring 16 and the focus ring 18, comprise the ceramic composition of the present invention, which includes a ceramic compound and an oxide of a Group IIIB metal from the periodic table by Mendeleef and as shown on page 789 of *The Condensed Chemical Dictionary*, tenth edition as revised by Gessner G. Hawley, and published by Van Nostrand Reinhold Company.

The ceramic compound for the ceramic composition is a compound that is typically electrically insulating and the crystallinity of which varies among amorphous, glassy, microcrystalline, and singly crystalline, dependent on material and its processing. The ceramic compound is preferably an essentially non-porous material. It is a good electrical insulator, and because it can be made in a relatively pure form (approximately 99% by weight or better) it has a low degree of chemical reactivity in the plasma environment. The ceramic compound may be any suitable ceramic compound that may combine with the oxide of Group IIIB metal to form a highly erosion-resistive ceramic structure, especially when processing power is passing through the dielectric member 20 during etching of a substrate (e.g. wafer substrate 13) in a high density plasma (e.g. high density plasma 94) of a processing gas. The ceramic compound is preferably selected from the group consisting of silicon carbide (SiC), silicon nitride ($Si_3N_4$), boron carbide ($B_4C$) boron nitride (BN), aluminum nitride (AlN), aluminum oxide ($Al_2O_3$) and mixtures thereof. More preferably, the ceramic compound comprises aluminum oxide ($Al_2O_3$), especially since aluminum oxide is relatively inexpensive and readily available.

The aluminum oxide should be sufficiently pure that it does not "out-gas" or include contaminants that could be sputtered onto the substrate during process operation, and it should be chemically stable when exposed to the particular etching processes contemplated. While aluminum oxide is a preferred ceramic compound for a preferred embodiment of the present invention, it is to be understood that the spirit and scope of the present invention includes other insulative materials which can provide similar effects, for example, the oxides and fluorides of aluminum, magnesium, and tantalum. Some of these are crystalline or polycrystalline insulating materials. Some may be made as glassy ceramics. Thus, the aluminum oxide or other metal oxide ceramics can be a single crystal oxide, polycrystalline oxide, or amorphous oxide. These materials are all electrically insulating and generally robust in a plasma etching environment and should not create undesired particulates in presence of the high density plasma 94. Other materials can alternatively be used.

The Group IIIB metal is a metal preferably selected from the group consisting of scandium (Sc), yttrium (Y), the cerium subgroup, the yttrium subgroup, and mixtures thereof. The cerium subgroup includes lanthanum (La), cerium (Ce), praseodymium (Pr), neodymium (Nd), promethium (Pm), and samarium (Sm). The yttrium subgroup includes europium (Eu), gadolinium (Gd), terbium (Tb), dysprosium (Dy), holmium (Ho), erbium (Er), thulium (Tm), ytterbium (Yb) and lutetium (Lu). In a preferred embodiment of the present invention, the Group IIIB metal is yttrium (Y); thus, the preferred oxide of a Group IIIB metal is $Y_2O_3$.

The dielectric member 20 and process kit 14 may be manufactured by any suitable ceramic manufacturing process, such as those processes described in Volume 4, entitled "Ceramics and Glasses," of the Engineered Materials Handbook by ASM International © 1991, and incorporated herein by reference thereto. Preferably, the dielectric member 20, the wafer-capture ring 16, and the focus ring 18 are manufactured by the following steps: (i) admixing the ceramic compound in powdered form, and the oxide of a Group IIIB metal in powdered form with a suitable additive agent, and a suitable binder agent to produce a powdered raw mixture; (ii) forming the powdered raw mixture to produce a formed powdered raw mixture; (iii) thermal processing (i.e., sintering) the formed powdered raw mixture to produce a rough ceramic product (i.e. a rough dielectric member 20 or a rough process kit 14); and (iv) finishing the rough ceramic product to produce a finished ceramic product (i.e. a finished dielectric member 20 or a finished process kit 14).

The powdered raw mixture which is to be subsequently formed comprises any suitable proportions of the ceramic compound, the oxide of a Group IIIB metal, the suitable additive agent and the suitable binder agent. Preferably, the powdered raw mixture comprises from about 10% by weight to about 85% by weight of the ceramic compound, from about 3% by weight to about 60% by weight of the oxide of a Group IIIB metal, from about 0.1% by weight to about 6% by weight of the suitable additive agent, and from about 5% by weight to about 35% by weight of the suitable binder agent. More preferably, the powdered raw mixture comprises from about 20% by weight to about 75% by weight of the ceramic compound, from about 5% by weight to about 55% by weight of the oxide of a Group IIIB metal, from about 0.5% by weight to about 5% by weight of the additive agent, and from about 10% by weight to about 30% by weight of the binder agent. Most preferably, the powdered raw mixture comprises from about 25% by weight to about 70% by weight of the ceramic compound, from about 10% by weight to about 50% by weight of the oxide of a Group IIIB metal, from about 0.5% by weight to about 4.5% by weight of the additive agent, and from about 12% by weight to about 28% by weight of the binder agent.

The suitable additive agent may be any suitable additive that leaves no residue, or ash, or other chemical contamination that will interfere with the thermal or sintering process or adversely affect the ultimate desired properties of the dielectric member 20 and the process kit 14. The additive agent is typically transient, but a portion of the additive agent is usually a permanent part of the chemical make-up of the ultimate ceramic product. The suitable additive agent may be any of the additive agents or suitable mixtures thereof disclosed in the previously mentioned Engineering Materials Handbook, such as by way of example only any suitable additive agent selected from the group consisting of solvents, dispersants, sintering aids, dopants, preservatives, surfactants, and mixtures thereof. Solvents include water, organic polar solvents (e.g,. fatty acids, amines, alcohols, aldehydes, esters, ethers, ketones, etc.), and organic nonpolar solvents (e.g. benzene, toluene, etc.). Dispersants comprise organic macromolecules and deflocculants (e.g. non-organic polyelectrolytes) and insure that powdered raw materials do not recombine or flocculate. Sintering aids are typically combinations of one or more oxides that may be added primarily to control grain growth and enhance densification. Grain growth and densification may also be affected by dopants which are oxide chemical additives, more typically oxides of metals having valences different from the primary oxide (e.g. the ceramic compound), that interact with surface chemistry for subsequently altering surface energetics. Preservatives may be added to insure that microbial action does not degrade binder properties during any holding periods. Surfactants modify interfacial characteristics between a dispersed phase and a solvent; and function as wetting agents for enabling effective total wetting of the powdered solids by the solvent, as antifoaming agents for minimizing bubble-type pores, and as rheological altering agents for altering the Theological properties of the solvent-powdered raw material composition and acting as plasticizers and/or lubricants.

The suitable binder agent may be any suitable binder which is capable of imparting sufficient strength and appropriate elastic properties to the formed powdered raw mixture for facilitating the handling and shaping of the formed powdered raw mixture during thermal processing of the same. The binder agent is typically transit, but a portion of the binder agent is usually a permanent part of the ultimate ceramic product. The suitable binder agent may be any of the binders, or suitable mixtures thereof, disclosed in the previously mentioned Engineering Materials Handbook, such as by way of example only any suitable binder agent selected from binders for aqueous systems, such as colloidal type binders (e.g. cellulose, clays), carbohydrate-derived organic binders (e.g. methyl cellulose, sodium alginate, natural gums, etc.), noncarbohydrate-derived organics (e.g. polyvinyl alcohol, acrylic resins, etc.), and binders for nonaqueous (organic solvent) systems, such as polyvinyl butyral and polymethylmethacrylate, and suitable mixture(s) of any of the foregoing binder agents.

After the powdered raw mixture has been produced it is then subsequently formed into a formed powdered raw mixture. Forming may be accomplished by any suitable process (e.g. casting, extrusion, dry pressing, etc.) that consist of compaction of the powdered raw mixture into a porous shape to achieve the greatest degree of particle packing and high degree of homogeneity. In a preferred embodiment of the invention, the formed powdered raw mixture is produced by dry pressing which is sometimes referred to as dust-pressing, die-pressing or uniaxial compaction. Dry pressing of the powdered raw mixture includes consolidating the powdered raw mixture inside a die cavity into a predetermined shape through the use of applied pressure acting in a uniaxial direction. In the present invention, the predetermined shape is preferably the shape of the dielectric member 20 (i.e. the dielectric window) or the shape of the wafer-capture ring 16 and the focus ring 18. Dry pressing is well known to those possessing ordinary skill in the art and is thoroughly described in the previously mentioned Engineered Materials Handbook, which has been incorporated herein by reference thereto. Dry pressing broadly comprises filling the die cavity with the powdered raw mixture, pressing or compacting the powdered raw mixture within the die cavity to produce a compacted or formed powdered raw mixture, and subsequently ejecting the formed powdered raw mixture.

The formed powdered raw mixture may be thermally processed in any suitable manner, preferably by sintering which provides interparticle bonding that generates the attractive forces needed to hold together the otherwise loose formed powdered raw mixture. Sintering is the result of atomic motion stimulated by a high temperature and causes the particles of the formed powdered raw mixture to bond together when heated to a high temperature. Sintering of the formed powdered raw mixture of the present invention may be performed with any suitable furnace (e.g. combustion or electric) at any suitable temperature, pressure, heating and cooling rate, and furnace atmospheric composition. Suitable temperatures, pressures, heating and cooling rates, and suitable atmospheric compositions are well known to those possessing ordinary skill in the art. The formed powdered raw mixture may be sintered in an electrically heated furnace having an oxide ceramic heating element, such as lanthanum chromite ($LaCr_2O_4$) or stabilized zirconia, and air as the furnace atmospheric composition.

After formed powdered raw mixture has been thermally processed, a rough ceramic product (i.e. a rough dielectric member 20 or a rough process kit 14) is produced. The rough ceramic product is preferably subsequently finally shaped, such as by grinding, lapping or polishing. If the rough ceramic product is a rough dielectric member 20 in the shape of a dielectric dome, it is preferably finally shaped by grinding. If the rough ceramic product is a rough wafer-capture ring 16 or a rough focus ring 18, it is preferably finally shaped by lapping or polishing. Grinding employs an abrasive machining method where diamond abrasives are held fixed in a grinding wheel and applied against the work surface (e.g. the inside and outside surface of a dome-shaped dielectric member 20) in a variety of configurations. Lapping is a free-abrasive machining method where loose or bonded abrasives in a low-pressure, low-speed operation achieve high geometric accuracy, correct minor shape errors, improve surface finish, or provide tight fits between mating surfaces. Polishing is also a free-abrasive machining method where loose abrasives of fine particle size and preselected hardness are employed to improve surface finish. Grinding, lapping, and polishing methods for shaping a rough ceramic product are all well known to those artisans possessing the ordinary skill in the art and are thoroughly described in the previously mentioned Engineered Materials Handbook.

The ceramic composition for the finished dielectric member 20 and process kit 14 comprises from about 30% by weight to about 95% by weight of the ceramic compound, from about 5% by weight to about 70% by weight of the oxide of a Group IIIB metal, and less than about 15% by weight (e.g. from about 0.5% by weight to about 15% by weight) of the combination of the suitable additive agent and the suitable binder agent since these agents are typically transient during the thermal processing. More preferably, the ceramic composition for the finished dielectric member 20 and process kit 14 comprises from about 40% by weight to about 85% by weight of the ceramic compound, from about 15% by weight to about 60% by weight of the oxide of a Group IIIB metal, and less than about 10% by weight (e.g. from about 0.5% by weight to about 15% by weight) of the additive agent and the binder agent; and most preferably from about 50% by weight to about 75% by weight of the ceramic compound, from about 30% by weight to about 45% by weight of an oxide of a Group IIIB metal, and less than about 5% by weight (e.g. from about 0.5% by weight to about 5% by weight) of the combination of the additive agent and the binder agent. Thus, the ceramic composition comprises a major proportion of the ceramic compound and a minor proportion of the oxide of a Group IIIB metal. When the ceramic compound is $Al_2O_3$ and the oxide of a Group IIIB metal is $Y_2O_3$, a preferred ceramic composition comprises from about 60% by weight to about 65% by weight $Al_2O_3$, from about 35% by weight to about 40% by weight $Y_2O_3$, and less than about 2.5% by weight (e.g. from about 0.5% by weight to about 2.5% by weight) and the combined additive and binder agents.

Figure 8:
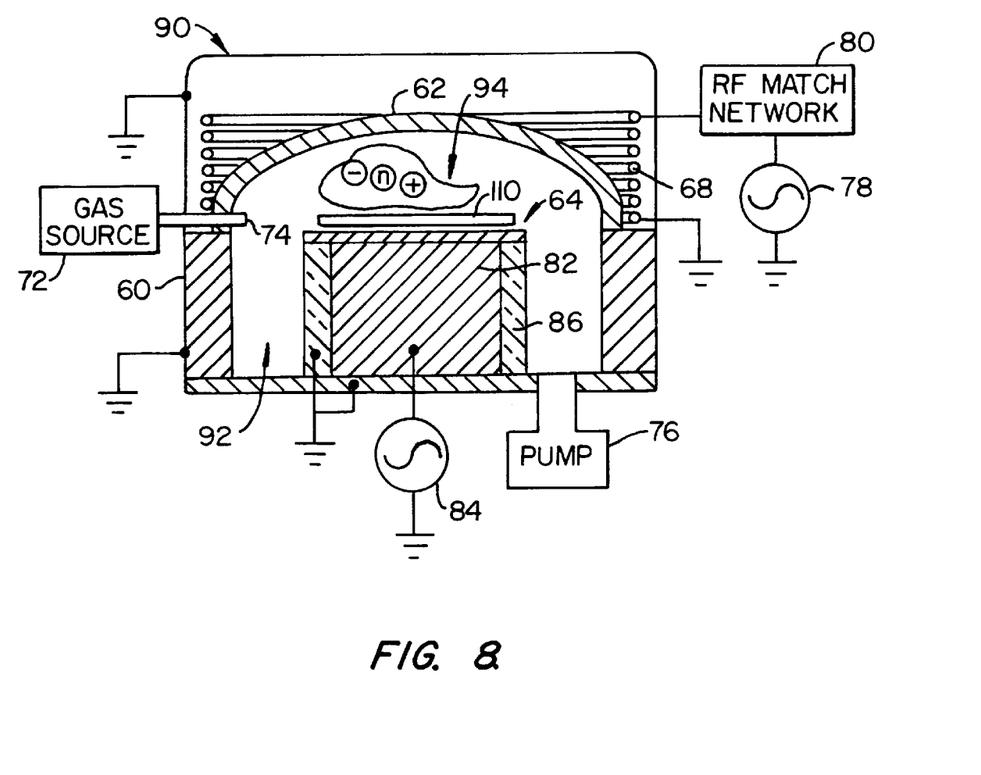
FIG. 8 is a simplified cut-away view of an inductively coupled RF plasma reactor having a dome-shaped dielectric ceiling comprising the ceramic composition of the present invention.

The ceramic composition of the present invention may be employed to manufacture any potentially erosive part of any processing apparatus, such as an electron cyclotron resonance (ECR) source reactor, a helicon source reactor, a helical resonator reactor, or an inductively coupled plasma reactor. Preferably, the ceramic composition of the present invention is employed to manufacture a dielectric window (i.e. a dome-shaped dielectric member 20 identified as "62" below) of an inductively coupled plasma reactor producing an inductive plasma source by inductively coupling a plasma in an associated decoupled plasma source etch chamber, which decouples or separates the ion flux to the wafer substrate 13 and the ion acceleration energy.

Inductively coupled plasma reactors are currently used to perform various processes on semiconductor wafers (e.g. wafer substrate 13) including metal etching, dielectric etching, chemical vapor deposition, and physical vapor deposition, as some examples. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the inductive coil and the D.C. bias power applied to the wafer pedestal are separately controlled RF supplies. Separating the bias and source power supplies facilitates independent control of ion density and ion energy, in accordance with well-known techniques. Plasma in an inductive source is created by application of RF power to a non-resonant inductive coil or to a planar coil. The application of RF power to a non-resonant inductive coil results in the breakdown of the process gas within a dielectric discharge chamber by the induced RF electric field which passes through the dielectric discharge chamber. Therefore, the coil inductor provides RF power which ignites and sustains the plasma of the processing gas.

A preferred inductively coupled plasma reactor, which includes a dielectric window comprising the ceramic composition of the present invention, is that which inductively couples a plasma in a decoupled plasma source etch chamber sold under the trademark DPST™ owned by Applied Materials, Inc., 3050 Bowers Avenue, Santa Clara, Calif. 95054-3299. The DPS™ brand etch chambers decouples or separates the ion flux to the substrate wafer 13 from the ion acceleration energy and may be any of the DPS™ brand etch chambers of the inductively coupled plasma reactors disclosed in U.S. Pat. No. 5,753,044, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIG. 8 for one preferred embodiment of an inductively coupled plasma reactor from U.S. Pat. No. 5,753,044, there is seen an inductively coupled RF plasma reactor generally illustrated as 90, having a reactor chamber, generally illustrated as 92, wherein the high density plasma 94 of neutral (n) particles, positive (+) particles, and negative (−) particles are found. The reactor chamber 92 has a grounded conductive cylindrical sidewall 60 and a dielectric window 62 which comprises the ceramic composition of the present invention. The inductively coupled RF plasma reactor 90 further comprises a wafer pedestal 64 for supporting a (semiconductor) wafer 110 in the center of the reactor chamber 92, a cylindrical inductor coil 68 surrounding an upper portion of the reactor chamber 92 beginning near the plane of the top of the wafer 110 or wafer pedestal 64 and extending upwardly therefrom toward the top of the reactor chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the reactor chamber 92 and is connected to the RF source power supply or the RF generator 78. The coil inductor 68 provides the RF power which ignites and sustains the high ion density of the high density plasma 94. The geometry of the coil inductor 68 can in large part determine spatial distribution of the plasma ion density of the high density plasma 94 within the reactor chamber 92.

Uniformity of the plasma density spatial distribution of the high density plasma 94 across the wafer 110 is improved (relative to conical or hemispherical ceilings) by shaping the dielectric window 62 in a multi-radius dome and individually determining or adjusting each one of the multiple radii of the dielectric window 62. The multiple-radius dome shape of the dielectric window 62 somewhat flattens the curvature of the dielectric window 62 around the center portion of the dielectric window 62, the peripheral portion of the dielectric window 62 having a steeper curvature.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A plasma reactor for processing substrates comprising a reactor chamber including a chamber wall;

a dielectric window supported by said chamber wall and comprising a ceramic composition including a ceramic compound and an oxide of a Group IIIB metal said ceramic composition of said dielectric window comprising from about 30% by weight to about 95% by weight of said ceramic compound and from about 5% by weight to about 70% by weight of said oxide of a Group IIIB metal;

a pedestal assembly disposed in said reactor chamber for supporting substrates in said reactor chamber;

a processing power source;

a processing gas-introducing assembly, engaged to said reactor chamber, for introducing a processing gas into said reactor chamber; and a processing power-transmitting member disposed in proximity to said reactor chamber and connected to said processing power source for transmitting power into the reactor chamber to aid in sustaining a plasma from a processing gas within the reactor chamber.

2. The plasma reactor of claim 1 additionally comprising a wafer-capture ring member supported by said pedestal assembly, said wafer-capture ring member comprising said ceramic composition including said ceramic compound and said oxide of a Group IIIB metal.

3. The plasma reactor of claim 2 additionally comprising a focus ring member disposed in said reactor chamber and releasably engaging the wafer-capture ring member, said focus ring member comprising said ceramic composition including said ceramic compound and said oxide of a Group IIIB metal.

4. The plasma reactor of claim 3 wherein said ceramic compound consists essentially of aluminum oxide and said oxide of a Group IIIB metal consists essentially of yttrium oxide.

5. The plasma reactor of claim 3 wherein said focus ring comprises a major proportion of said ceramic compound and a minor proportion of said oxide of a Group IIIB metal.

6. The plasma reactor of claim 5 wherein said ceramic compound is selected from the group consisting of silicon carbide, silicon nitride, boron carbide, boron nitride, aluminum nitride, aluminum oxide, and mixtures thereof.

7. The plasma reactor of claim 3 wherein said ceramic composition of said focus ring member comprises from about 30% by weight to about 95% by weight of said ceramic compound and from about 5% by weight to about 70% by weight of said oxide of a Group IIIB metal.

8. The plasma reactor of claim 3 wherein said ceramic composition of said focus ringer member comprises from about 40% by weight to about 85% by weight of the ceramic compound and from about 15% by weight to about 60% by weight of the oxide of a Group IIIB metal.

9. The plasma reactor of claim 3 wherein said ceramic composition of said focus ring member comprises from about 50% by weight to about 75% by weight of the ceramic compound and from about 30% by weight to about 40% by weight of the oxide of a Group IIIB metal.

10. The plasma reactor of claim 2 wherein said ceramic composition of said wafer-capture ring member comprises from about 30% by weight to about 95% by weight of said ceramic compound and from about 5% by weight to about 70% by weight of said oxide of a Group IIIB metal.

11. The plasma reactor of claim 2 wherein said ceramic composition of said wafer-capture ring member comprises from about 40% by weight to about 85% by weight of the ceramic compound and from about 15% by weight to about 60% by weight of the oxide of a Group IIIB metal.

12. The plasma reactor of claim 2 wherein said ceramic composition of said wafer-capture ring member comprises from about 50% by weight to about 75% by weight of the ceramic compound and from about 30% by weight to about 40% by weight of the oxide of a Group IIIB metal.

13. The plasma reactor of claim 1 wherein said ceramic compound is selected from the group consisting of silicon carbide, silicon nitride, boron carbide, boron nitride, aluminum nitride, aluminum oxide, and mixtures thereof.

14. The plasma reactor of claim 1 wherein said ceramic compound consists essentially of aluminum oxide and said oxide of a Group IIIB metal consists essentially of yttrium oxide.

15. The plasma reactor of claim 1 wherein said ceramic composition of said dielectric wall comprises from about 40% by weight to about 85% by weight of the ceramic compound and from about 15% by weight to about 60% by weight of the oxide of a Group IIIB metal.

16. The plasma reactor of claim 1 wherein said ceramic composition of said dielectric window comprises from about 50% by weight to about 75% by weight of the ceramic compound and from about 30% by weight to about 40% by weight of the oxide of a Group IIIB metal.

17. The plasma reactor of claim 1 wherein said ceramic composition of said dielectric window comprises from about 60% by weight to about 65% by weight of $Al_2O_3$ and from about 35% by weight to about 40% by weight $Y_2O_3$.

18. The plasma reactor of claim 1 additionally comprising transmitted power from said processing power-transmitting member passing through said dielectric window including said ceramic composition.

19. An inductively coupled RF plasma reactor for processing semiconductor wafers comprising:
 a reactor chamber having a chamber wall and a dome-shaped ceiling supported by said chamber wall, said dome-shaped ceiling comprising a first ceramic composition including a first ceramic compound and a first oxide of a Group IIIB metal, said first ceramic composition of said dome-shaped ceiling comprising from about 30% by weight to about 95% by weight of said, first ceramic compound and from about 5% by weight to about 70% by weight of said first oxide of a Group IIIB metal;
 a wafer pedestal assembly disposed in said reactor chamber for supporting semiconductor wafers in said reactor chamber;
 an inductively coupled RF power source;
 means, engaged to said reactor chamber, for introducing a processing gas into said reactor chamber;
 a coil inductor disposed adjacent to said reactor chamber and connected to said inductively coupled RF power source; and
 a bias RF source connected to said wafer pedestal assembly.

20. The inductively coupled RF plasma reactor of claim 19 additionally comprising a high density plasma of a processing gas disposed in said reactor chamber.

21. The inductively coupled RF plasma reactor of claim 20 additionally comprising RF processing power passing through said dome-shaped ceiling.

22. The inductively coupled RF plasma reactor of claim 19 additionally comprising a wafer-capture ring member supported by said wafer pedestal assembly, said wafer-capture ring member comprising a second ceramic composition including a second ceramic compound and a second oxide of a Group IIIB metal.

23. The inductively coupled RF plasma reactor of claim 22 additionally comprising a focus ring member ring member disposed in said reactor chamber and releasably engaging the wafer-capture ring member, said focus ring member comprising a third ceramic composition including a third ceramic compound and a third oxide of a Group IIIB metal.

24. The inductively coupled RF plasma reactor of claim 23 wherein said first ceramic composition comprises a major proportion of said first ceramic compound and a minor proportion of said first oxide of a Group IIIB metal.

25. The inductively coupled RF plasma reactor of claim 23 wherein said second ceramic compound is selected from the group consisting of silicon carbide, silicon nitride, boron carbide, boron nitride, aluminum nitride, aluminum oxide, and mixtures thereof.

26. The inductively coupled RF plasma reactor of claim 23 wherein said second ceramic compound consists essentially of aluminum oxide and said second oxide of a Group IIIB metal consists essentially of yttrium oxide.

27. The inductively coupled RF plasma reactor of claim 23 wherein said third ceramic composition of said focus ring member comprises from about 40% by weight to about 85% by weight of the third ceramic compound and from about 15% by weight to about 60% by weight of the third oxide of a Group IIIB metal.

28. The inductively coupled RF plasma reactor of claim 23 wherein said third ceramic composition of said focus ring member comprises from about 50% by weight to about 75% by weight of the third ceramic compound and from about 30% by weight to about 40% by weight of the third oxide of a Group IIIB metal.

29. The inductively coupled RF plasma reactor of claim 23 wherein said third ceramic composition of said focus ring member comprises from about 60% by weight to about 65% by weight of $Al_2O_3$ and from about 35% by weight to about 40% by weight of $Y_2O_3$.

30. The inductively coupled RF plasma reactor of claim 22 wherein said second ceramic composition of said wafer-capture ring member comprises from about 30% by weight to about 95% by weight of the second ceramic compound and from about 5% by weight to about 70% by weight of the second oxide of a Group IIIB metal.

31. The inductively coupled RF plasma reactor of claim 22 wherein said second ceramic composition of said wafer-capture ring member comprises from about 40% by weight to about 85% by weight of the second ceramic compound and from about 15% by weight to about 60% by weight of the second oxide of a Group IIIB metal.

32. The inductively coupled RF plasma reactor of claim 22 wherein said second ceramic composition of said wafer-capture ring member comprises from about 50% by weight to about 75% by weight of the second ceramic compound and from about 30% by weight to about 40% by weight of the second oxide of a Group IIIB metal.

33. The inductively coupled RF plasma reactor of claim 19 wherein said first ceramic compound is selected from the group consisting of silicon carbide, silicon nitride, boron carbide, boron nitride, aluminum nitride, aluminum oxide, and mixtures thereof.

34. The inductively coupled RF plasma reactor of claim 19 wherein said first ceramic compound consists essentially of aluminum oxide and said first oxide of a Group IIIB metal consists essentially of yttrium oxide.

35. The inductively coupled RF plasma reactor of claim 19 wherein said first ceramic composition of said dielectric window comprises from about 40% by weight to about 85% by weight of the first ceramic compound and from about 15% by weight to about 60% by weight of the first oxide of a Group IIIB metal.

36. The inductively coupled RF plasma reactor of claim 19 wherein said ceramic composition of said dielectric window comprises from about 50% by weight to about 75% by weight of the ceramic compound and from about 30% by weight to about 40% by weight of the first oxide of a Group IIIB metal.

37. The inductively coupled RF plasma reactor of claim 19 wherein said first ceramic composition of said dielectric window comprises from about 60% by weight to about 65% by weight of $Al_2O_3$ and from about 35% by weight to about 40% by weight $Y_2O_3$.

38. A process kit for processing semiconductor substrates comprising a first ring member having a first ceramic composition including a first ceramic compound and a first oxide of a Group IIIB metal said first ceramic composition comprises from about 30% by weight to about 95% by weight of said first ceramic compound and from about 5% by weight to about 70% by weight of said first oxide of a Group IIIB metal.

39. The process kit of claim 38 additionally comprising a second ring member releasably engaging a second ring member and including a second ceramic composition comprising said ceramic compound and a second oxide of a Group IIIB metal.

40. The process kit of claim 39 wherein said first ceramic compound consists essentially of aluminum oxide and said first oxide of a Group IIIB metal consists essentially of yttrium oxide.

41. The process kit of claim 39 wherein said second ceramic composition comprises from about 30% by weight to about 95% by weight of said second ceramic compound and from about 5% by weight to about 70% by weight of said second oxide of a Group IIIB metal.

42. The process kit of claim 39 wherein said second ceramic composition comprises from about 40% by weight to about 85% by weight of the second ceramic compound and from 15% by weight to ab out 60% by weight of the second oxide of a Group IIIB metal.

43. The process kit of claim 39 wherein said second ceramic composition comprises from about 50% by weight to about 75% by weight of the second ceramic compound and from about 30% by weight to about 40% by weight of the second oxide of a Group IIIB metal.

44. The process kit of claim 38 wherein said first ceramic composition comprises from about 40% by weight to about 85% by weight of the first ceramic compound and from about 15% by weight to about 60% by weight of the first oxide of a Group IIIB metal.

45. The process kit of claim 38 herein said first ceramic composition comprises from about 50% by weight to about 75% by weight of the first ceramic compound and from about 30% by weight to about 40% by weight of the first oxide of a Group IIIB metal.

46. A dielectric member having a high erosion resistance during processing of a substrate in a high density plasma of a processing gas comprising a ceramic composition including a ceramic compound and an oxide of a Group IIIB metal, said ceramic composition comprises from about 30% by weight to about 95% by weight of said ceramic compound and from about 5% by weight to about 70% by weight of said oxide of a Group IIIB metal.

47. The dielectric member of claim 46 additionally comprising processing power passing through said ceramic composition.

48. The dielectric member of claim 47 wherein said ceramic composition comprises from about 40% by weight to about 85% by weight of the ceramic compound and from about 15% by weight to about 60% by weight of the oxide of a Group IIIB metal.

49. The dielectric member of claim 47 wherein said ceramic composition comprises from about 50% by weight to about 75% by weight of the ceramic compound and from about 30% by weight to about 40% by weight of the oxide of a Group IIIB metal.

50. The dielectric member of claim 46 wherein said ceramic compound consists essentially of aluminum oxide and said oxide of a Group IIIB metal consists essentially of yttrium oxide.

51. The dielectric member of claim 46 wherein said ceramic composition comprises from about 40% by weight to about 85% by weight of the ceramic compound and from about 15% by weight to about 60% by weight of the oxide of a Group IIIB metal.

52. The dielectric member of claim 46 wherein said ceramic composition comprises from about 50% by weight to about 75% by weight of the ceramic compound and from about 30% by weight to about 40% by weight of the oxide of a Group IIIB metal.

* * * * *